(12) United States Patent
Wang et al.

(10) Patent No.: US 7,420,386 B2
(45) Date of Patent: Sep. 2, 2008

(54) TECHNIQUES FOR PROVIDING FLEXIBLE ON-CHIP TERMINATION CONTROL ON INTEGRATED CIRCUITS

(75) Inventors: Xiaobao Wang, Cupertino, CA (US); Chiakang Sung, Milpitas, CA (US); Khai Q. Nguyen, San Jose, CA (US)

(73) Assignee: Altera Corporation, San Jose, CA (US)

( * ) Notice: Subject to any disclaimer, the term of this patent is extended or adjusted under 35 U.S.C. 154(b) by 35 days.

(21) Appl. No.: 11/381,356

(22) Filed: May 2, 2006

(65) Prior Publication Data

US 2007/0236247 A1 Oct. 11, 2007

Related U.S. Application Data

(60) Provisional application No. 60/789,760, filed on Apr. 6, 2006.

(51) Int. Cl.
*H03K 17/16* (2006.01)
(52) U.S. Cl. .......................................... 326/30; 326/86
(58) Field of Classification Search ............... 326/30, 326/82–83, 86–87, 21, 26; 327/108
See application file for complete search history.

(56) References Cited

U.S. PATENT DOCUMENTS

| | | | |
|---|---|---|---|
| 4,719,369 A | 1/1988 | Asano et al. | |
| 5,134,311 A | 7/1992 | Biber et al. | |
| 5,254,883 A | 10/1993 | Horowitz et al. | |
| 5,764,080 A | 6/1998 | Huang et al. | |
| 6,064,224 A * | 5/2000 | Esch et al. | 326/30 |
| 6,094,069 A * | 7/2000 | Magane et al. | 326/83 |
| 6,118,310 A | 9/2000 | Esch et al. | |
| 6,366,128 B1 | 4/2002 | Ghia et al. | |
| 6,384,621 B1 | 5/2002 | Gibbs et al. | |
| 6,433,579 B1 | 8/2002 | Wang et al. | |
| 6,445,245 B1 | 9/2002 | Schultz et al. | |
| 6,489,837 B2 * | 12/2002 | Schultz et al. | 327/541 |
| 6,515,501 B2 | 2/2003 | Bosnyak et al. | |
| 6,586,964 B1 | 7/2003 | Kent et al. | |
| 6,590,413 B1 | 7/2003 | Yang | |
| 6,603,329 B1 * | 8/2003 | Wang et al. | 326/30 |
| 6,605,958 B2 | 8/2003 | Bergman et al. | |
| 6,798,237 B1 | 9/2004 | Wang et al. | |
| 6,812,732 B1 * | 11/2004 | Bui | 326/30 |
| 6,812,734 B1 | 11/2004 | Shumarayev et al. | |

(Continued)

OTHER PUBLICATIONS

"Virtex-II Pro and Virtex-II Pro X FPGA User Guide," Mar. 23, 2005, pp. 223-240.

(Continued)

*Primary Examiner*—Rexford Barnie
*Assistant Examiner*—Christopher Lo
(74) *Attorney, Agent, or Firm*—Steven J. Cahill

(57) ABSTRACT

On-chip termination (OCT) calibration techniques are provided that support input/output (IO) banks on an integrated circuit (IC) using OCT controllers. The OCT controllers calibrate the on-chip termination impedance in the IO banks using a shared parallel bus or separate parallel buses. Multiplexers or select logic in each IO bank select control signals from the OCT controllers in response to select signals. According to some embodiments, each of the IO banks on an IC can receive OCT control signals from any of the OCT controllers on the IC.

20 Claims, 7 Drawing Sheets

U.S. PATENT DOCUMENTS

| | | | |
|---|---|---|---|
| 6,836,142 B2 * | 12/2004 | Lesea et al. | 326/30 |
| 6,836,144 B1 | 12/2004 | Bui et al. | |
| 6,859,064 B1 * | 2/2005 | Maangat | 326/30 |
| 6,888,369 B1 | 5/2005 | Wang et al. | |
| 6,888,370 B1 | 5/2005 | Luo et al. | |
| 6,894,529 B1 | 5/2005 | Chong et al. | |
| 6,980,022 B1 | 12/2005 | Shumarayev et al. | |
| 7,218,155 B1 | 5/2007 | Chang et al. | |
| 7,221,193 B1 | 5/2007 | Wang et al. | |
| 7,239,171 B1 | 7/2007 | Wang et al. | |
| 2002/0101278 A1 | 8/2002 | Schultz et al. | |
| 2003/0218477 A1 * | 11/2003 | Jang et al. | 326/30 |
| 2004/0008054 A1 | 1/2004 | Lesea et al. | |
| 2004/0113653 A1 | 6/2004 | Lundberg | |
| 2005/0012533 A1 | 1/2005 | Aoyama et al. | |

OTHER PUBLICATIONS

"Stratix II Device Handbook, vol. 2: 4. Selectable I/O Standards in Stretix II & Stretix II GX Devices," Altera Corporation, Dec. 2005, pp. 4-1 through 4-42.

U.S. Appl. No. 11/356,867, filed Feb. 18, 2006, Santurkar et al.
U.S. Appl. No. 11/364,371, filed Feb. 28, 2006, Shumarayev et al.
U.S. Appl. No. 60/786,129, filed Mar. 27, 2006, Santurkar et al.
U.S. Appl. No. 11/383,937, filed May 17, 2006, Santurkar et al.

* cited by examiner

TECHNIQUES FOR PROVIDING FLEXIBLE ON-CHIP TERMINATION CONTROL ON INTEGRATED CIRCUITS

CROSS REFERENCE TO RELATED APPLICATION

This patent application claims the benefit of U.S. provisional patent application 60/789,760, filed Apr. 6, 2006, which is incorporated by reference herein.

BACKGROUND OF THE INVENTION

1. Field of the Invention

The present invention relates to on-chip termination impedance control, and more particularly, to techniques for providing greater flexibility with respect to on-chip termination impedance control on an integrated circuit.

2. Description of the Related Art

Signal reflection can occur on transmission lines when there is a mismatch between the impedance of the transmission line and the impedance of the transmitter and/or receiver. The reflected signal can interfere with the transmitted signal, causing distortion and degrading signal integrity.

To solve this problem, transmission lines are resistively terminated by a matching impedance to minimize or eliminate signal reflection. Input/output (IO) pins on an integrated circuit package are often terminated by coupling external termination resistors to the appropriate IO pins. However, many integrated circuit packages require a large number of termination resistors, because they have a large number of IO pins. Therefore, it is becoming more common to resistively terminate transmission lines using on-chip termination (OCT) to reduce the number of external components.

The Stratix® II field programmable gate array (FPGA) made by Altera, Corporation of San Jose, Calif. has calibrated on-chip termination to support a wide range of high-speed memory interfaces in a single device. Because different memory interfaces require different power supply voltages, input/output (IO) buffers are arranged in input/output (IO) banks in order to support memory interfaces flexibly. Each bank has its own power supply independent of other IO banks. IO buffers within the same IO bank share the same power supply. Calibrated on-chip source termination (Rs) and parallel termination (Rt) are supported in top and bottom IO banks to achieve higher memory interface performance. But the side IO banks on the FPGA do not support calibrated source and parallel on-chip termination. As a result, the side IO banks can only support lower performance memory interfaces.

Therefore, it would be desirable to provide increased flexibility on an FPGA by allowing more of the IO banks to support high speed memory interfaces.

BRIEF SUMMARY OF THE INVENTION

The present invention provides on-chip termination (OCT) calibration techniques that support input/output (IO) banks on an integrated circuit (IC) using OCT controllers. The OCT controllers calibrate the on-chip termination impedance in the IO banks using a shared parallel bus or separate parallel buses. Select logic or multiplexers in each IO bank select control signals from the OCT controllers in response to select signals.

According to some embodiments of the present invention, each of the IO banks on an IC can receive OCT control signals from any of the OCT controllers on the IC. The present invention improves the efficiency and utilization of OCT support in the IO banks.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1A:
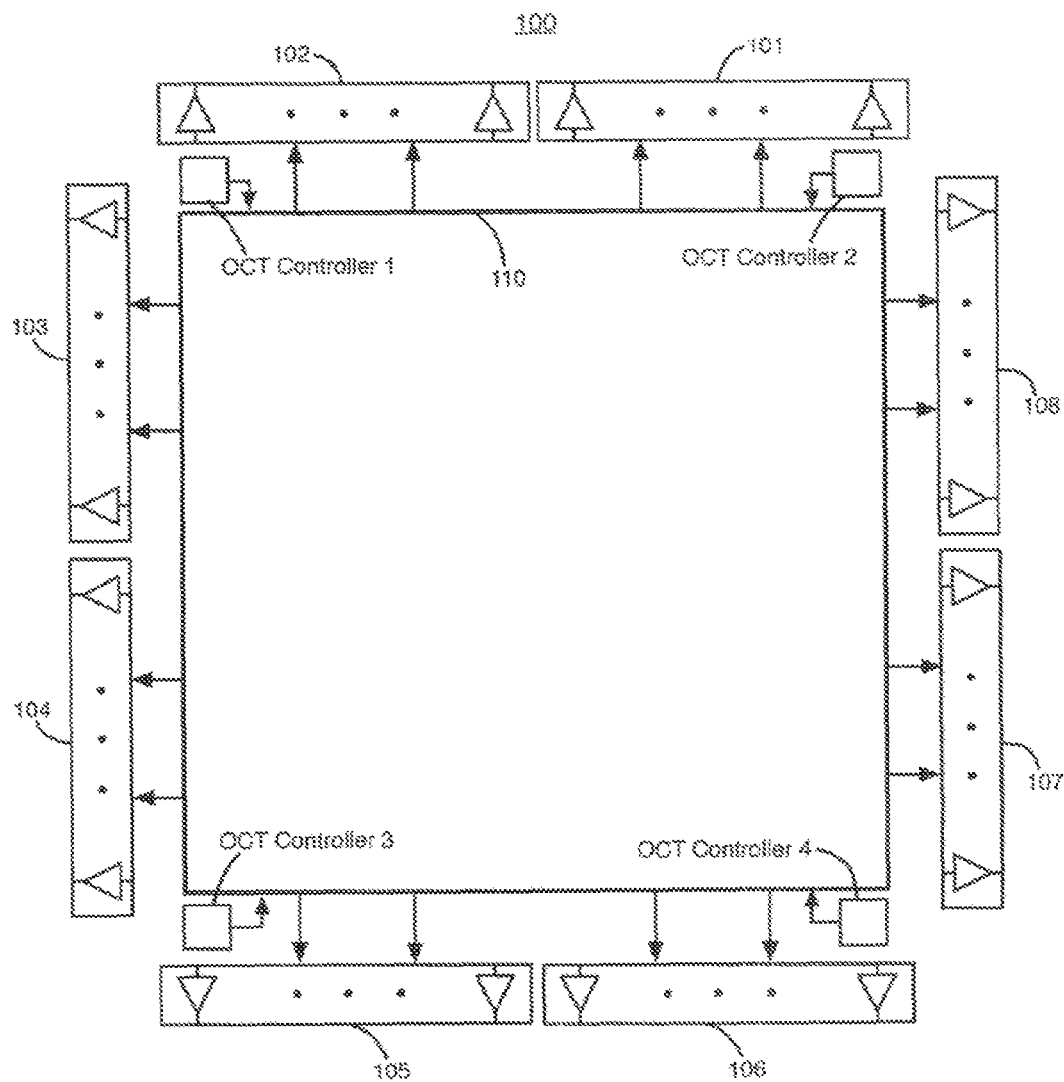
FIG. 1A illustrates an integrated circuit with four OCT controllers that can route OCT control signals to any of the IO banks on the chip, according to an embodiment of the present invention.

A first embodiment of the present invention is shown in FIG. 1A. According to the embodiment of FIG. 1A, on-chip source termination and on-chip parallel termination is supported in all IO banks on an integrated circuit (IC) 100. IC 100 contains 4 on-chip termination (OCT) controllers 1, 2, 3, and 4, and 8 IO banks 101-108. OCT controllers 1-4 can drive control signals along bus 110 to control the on-chip termination impedance at IO buffers in any of IO banks 101-108. As a result, the architecture of IC 100 provides a high degree of flexibility.

The architecture of IC 100 allows more IO banks on an IC to support high performance memory interfaces, because OCT control signals from an OCT controller can be driven to any IO bank on the chip. In FIG. 1A, only 8 IO banks with 4 OCT controllers are shown for ease of illustration. According to further embodiments, more or less IO banks and OCT controllers can be provided on an IC in similar fashion.

In FIG. 1A, any of the OCT controllers can be used to control any of the IO banks, provided that the power supply voltages in the OCT controller and the IO bank controlled by it are the same. For example, IO bank 101, IO bank 103 and IO bank 105 can be controlled by OCT controller 1, as long as the supply voltages for IO banks 101, 103, and 105 are the same. IC 100 provides improved efficiency and utilization of OCT support in the IO banks.

The present invention provides a flexible and ubiquitous OCT calibration architecture that maximizes the potential for supporting different memory interfaces with different voltages in FPGA (and ASIC) devices. The OCT controllers are shared among all the IO banks on an IC. Top, bottom, and side IO banks all support OCT calibration from any of the OCT controllers on the chip. The cost of providing this level of OCT support is small, but the flexibility that it provides greatly enhances the efficiency and utilization of an FPGA device for users.

Figure 1B:
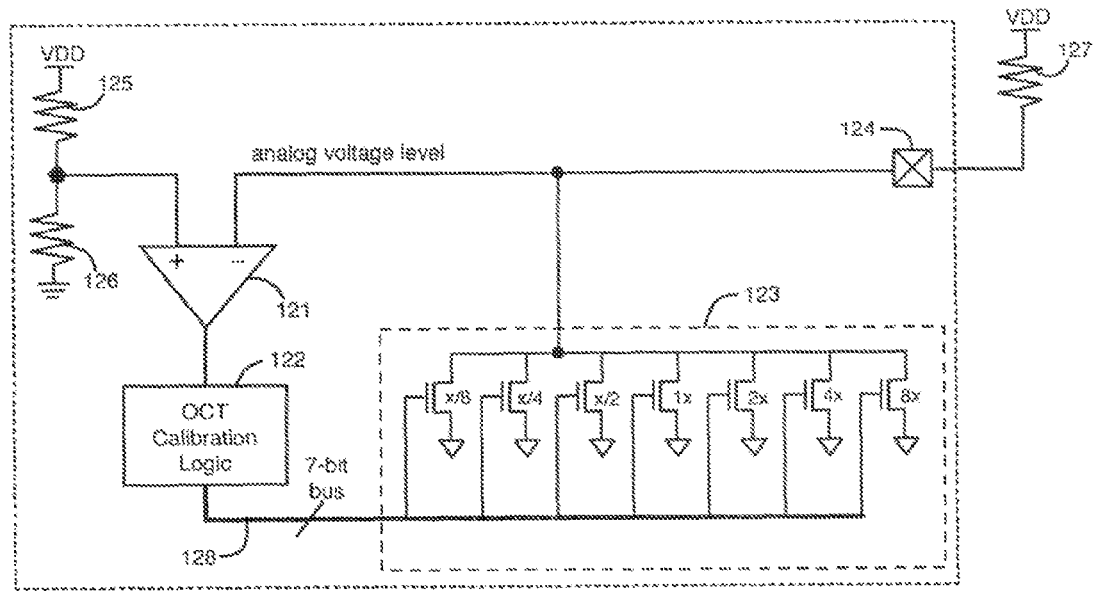
FIG. 1B illustrates a pull-down portion of an on-chip termination (OCT) controller that can be used to implement embodiments of the present invention.
Figure 1C:
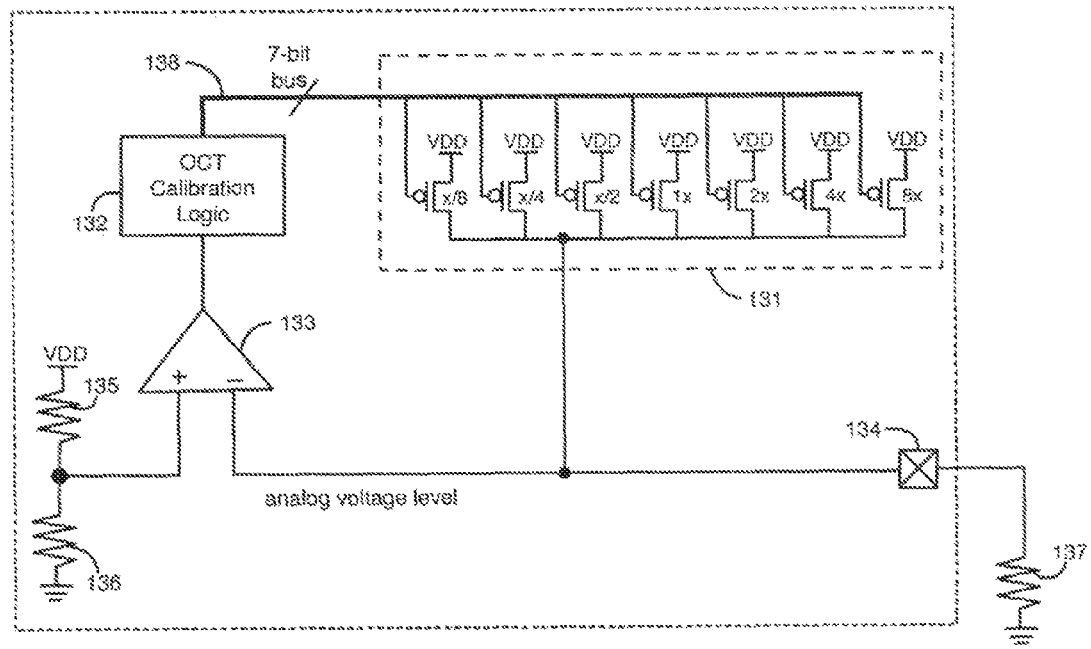
FIG. 1C illustrates a pull-up portion of an on-chip termination (OCT) controller that can be used to implement embodiments of the present invention.

Further details of an implementation of an OCT controller are shown and described with respect to FIGS. 1B-1C. Each OCT controller typically has a set of pull-down transistors (NMOS) 123 as shown in FIG. 1B and a set of pull-up transistors (PMOS) 131 as shown in FIG. 1C (e.g., 7 transistors in each set). The set of pull-up transistors 131 are coupled together in parallel, and the set of pull-down transistors 123 are coupled in parallel.

The sizes (W/L channel ratios) of the transistors in the OCT controllers are binary-weighted. For example, the following ratios can be used to size the pull-up transistors as well as the pull-down transistors: ⅛×, ¼×, ½×, 1×, 2×, 4×, 8×. The transistor with ⅛× size is the smallest, and the transistor with the 8× size is the largest. Each transistor can be individually enabled or disabled by digital signals.

Referring to FIG. 1B, comparator 121 compares a reference voltage created by resistors 125 and 126 with the voltage at pin 124. Pin 124 is coupled to transistors 123 and external resistor 127. The output of comparator 121 is coupled to OCT calibration logic 122. OCT calibration logic 122 generates a set of digital OCT control signals on 7-bit bus 128 in response to the output of comparator 121. The OCT control signals on bus 128 dynamically enable or disable transistors 123 until the impedances match.

Referring to FIG. 1C, comparator 133 compares a reference voltage created by resistors 135 and 136 with the voltage at pin 134. Pin 134 is coupled to transistors 131 and external resistor 137. The output of comparator 133 is coupled to OCT calibration logic 132. OCT calibration logic 132 generates a set of digital OCT control signals on a 7-bit bus 138 in response to the output of comparator 133. The OCT control signals dynamically enable or disable transistors 131 until the impedances match.

After calibration is complete, the impedance of the PMOS transistors 131 match external resistor 137, and the impedance of the NMOS transistors 123 match external resistor 127. The OCT control signals on buses 128 and 138 are then transmitted to IO banks where they are used to control the on-chip termination impedance of pull-up and pull-down binary-weighted transistors in the IO buffers. The OCT calibration process compensates for process, voltage, and temperature (PVT) variations on the IC.

Parallel on-chip termination (Rt) is implemented using the same transistors as source on-chip termination (Rs), except that both the PMOS and the NMOS transistors are enabled simultaneously to form a Thevenin circuit. Parallel OCT (Rt) is often selected to be 50 ohm, because a typical transmission line impedance is 50 ohm. Because a transistor I-V curve is non-linear, and is usually in the saturation region when Vds=½*VCCN or above, the impedance of the transistor at Vds=VCCN is about twice the impedance at Vds=½*VCCN, where VCCN is the power supply voltage. A transistor is in saturation when its drain-source current (Ids) no longer increases with increasing drain-source voltage (Vds). The same PMOS and NMOS transistors with the calibrated impedance, Rs=50 ohm at Vds=½*VCCN can be used to implement Rt=50 ohm.

According to a further embodiment of the present invention, OCT controllers on an integrated circuit (IC) can transmit OCT control signals around the periphery of the IC (as shown in FIG. 1A) to any of the IO banks along a shared bus. Further details of this embodiment are shown and described with respect to FIG. 2.

Each OCT controller on the chip (such as OCT controllers 201 and 204) can transmit OCT control signals to any of the IO banks on the chip (such as IO bank 200) along parallel bus 210. Each OCT controller generates a set of parallel OCT control signals. For example, OCT controllers 201 and 204 can each generate 14 parallel OCT control signals. The OCT control signals are routed in parallel along bus 210 to one or more of the IO banks.

Figure 2:
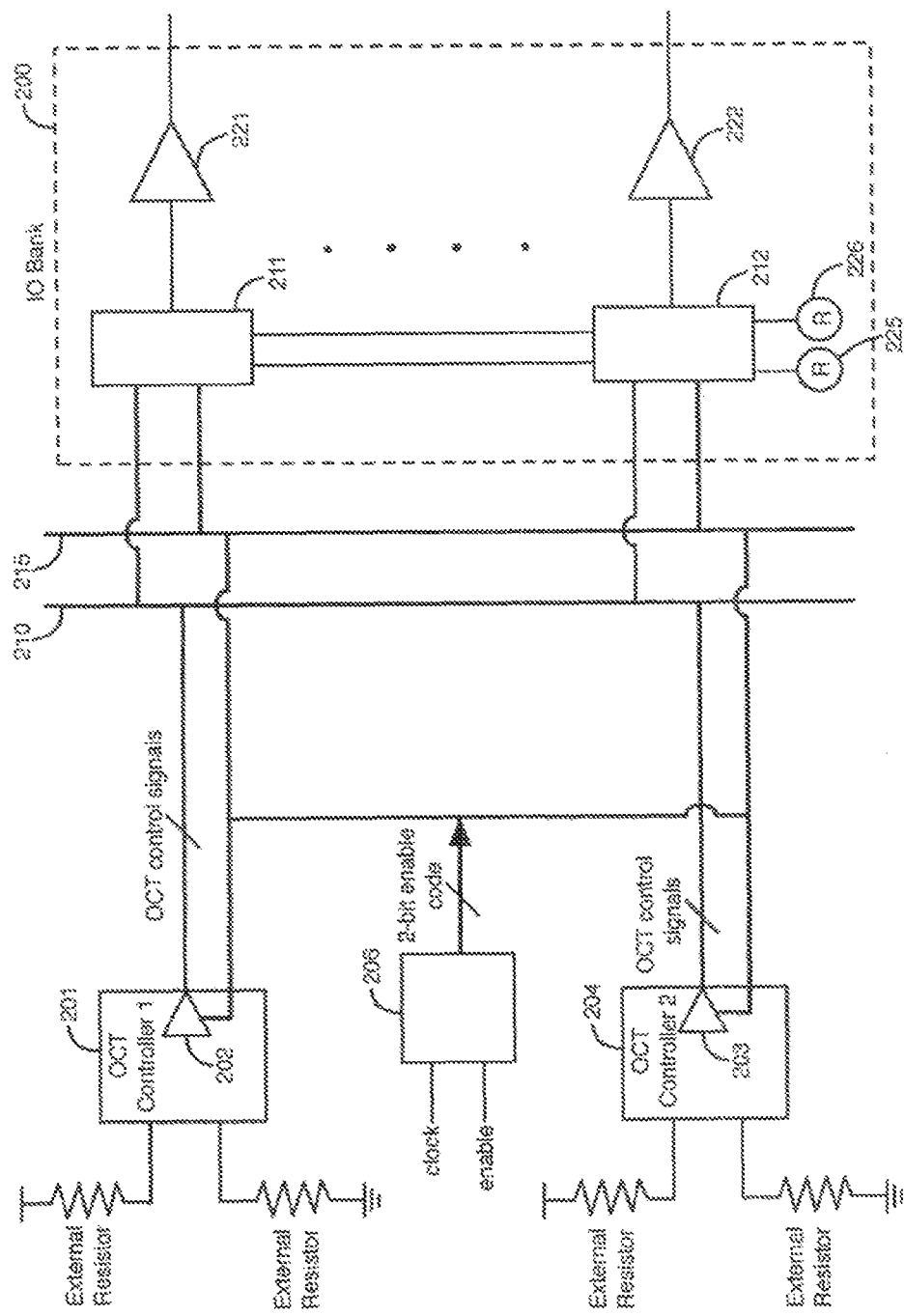
FIG. 2 illustrates a portion of an integrated circuit with OCT controllers that can be selectively coupled to an IO bank through a shared bus by OCT select logic blocks, according to an embodiment of the present invention.

The OCT control signals from all of the OCT controllers are transmitted along one shared bus 210 in the embodiment of FIG. 2. However, only one of the OCT controllers can transmit OCT control signals along bus 210 at any given time. 2-bit counter 206 in FIG. 2 controls the traffic along bus 210. Two inputs of 2-bit counter 206 are coupled to receive a clock signal and an enable signal. The clock and enable signals may be controlled by a user.

The two-bit counter 206 outputs a 2-bit encoded OCT enable code that is transmitted in parallel around the chip along bus 215 to each of the OCT controllers (including controllers 201 and 204) and each of the IO banks on the IC. In the embodiment of FIG. 2, counter 206 generates a 2-bit enable code that is encoded to provide 4 different states (00, 01, 10, 11) that control when signals from 4 different OCT controllers are sent along bus 210. According to further embodiments, counter 206 can output an enable code with 1-bit (for controlling signals from 2 OCT controllers), 3-bits (for controlling signals from up to 8 OCT controllers), or more than 3-bits (for controlling signals from more than 8 OCT controllers). The number of enable signals in the enable code is at least $\log_2(M)$, where M is the number of OCT controllers.

When the enable signal input is low, counter 206 maintains the value of the 2-bit enable code constant. When the enable signal input is high, counter 206 increases the value of the 2-bit enable code on bus 215 from 00, to 01, to 10, to 11. The clock signal controls the timing of the counter. A user can cause the enable signal to go high when the user wants to recalibrate the on-chip termination impedance in one or more of the IO banks.

The 2-bit encoded OCT enable code generated by counter 206 controls the state of tristate drivers in each of the OCT controllers. For example, the 2-bit enable code controls the states of tristate drivers 202 in OCT controller 201 and tristate drivers 203 in OCT controller 204. The tristate drivers in each OCT controller on the IC drive the OCT control signals from the OCT controller to bus 210 when the 2-bit enable code is in a particular predefined state. When the 2-bit enable code is not in the predefined state, the output of the OCT controller is tri-stated (disabled). 2-bit counter 206 enables the OCT controllers in sequence.

For example, tristate drivers 202 only drive the 14-bit OCT control signals from OCT controller 201 to bus 210 when the 2-bit enable code is 00, and tristate drivers 203 only drive the 14-bit OCT control signals from OCT controller 204 to bus 210 when the 2-bit enable code is 11. In this way, the 2-bit enable code only allows one OCT controller to transmit OCT control signals to the IO banks on bus 210 at a time.

Thus, only one of the OCT controllers on the IC provides active outputs at any time. The binary state of the 2-bit enable code indicates which of the OCT controllers is actively outputting OCT control signals to bus 210 (e.g., 00 indicates that OCT controller 201 is active). By sequentially increasing the 2-bit enable code in response to the enable signal, counter 206 can sequentially enable each of the OCT controllers to control the on-chip termination in selected IO banks through bus 210.

The OCT control signals are received in each IO bank from bus 210 at a set of OCT select logic blocks (including select logic blocks 211 and 212). The OCT select logic blocks determine when to couple OCT control signals on bus 210 to corresponding IO buffers. For example, OCT select logic block 211 can couple OCT control signals on bus 210 to IO buffer 221, and OCT select logic block 212 can couple OCT control signals on bus 210 to IO buffer 222.

Figure 3:
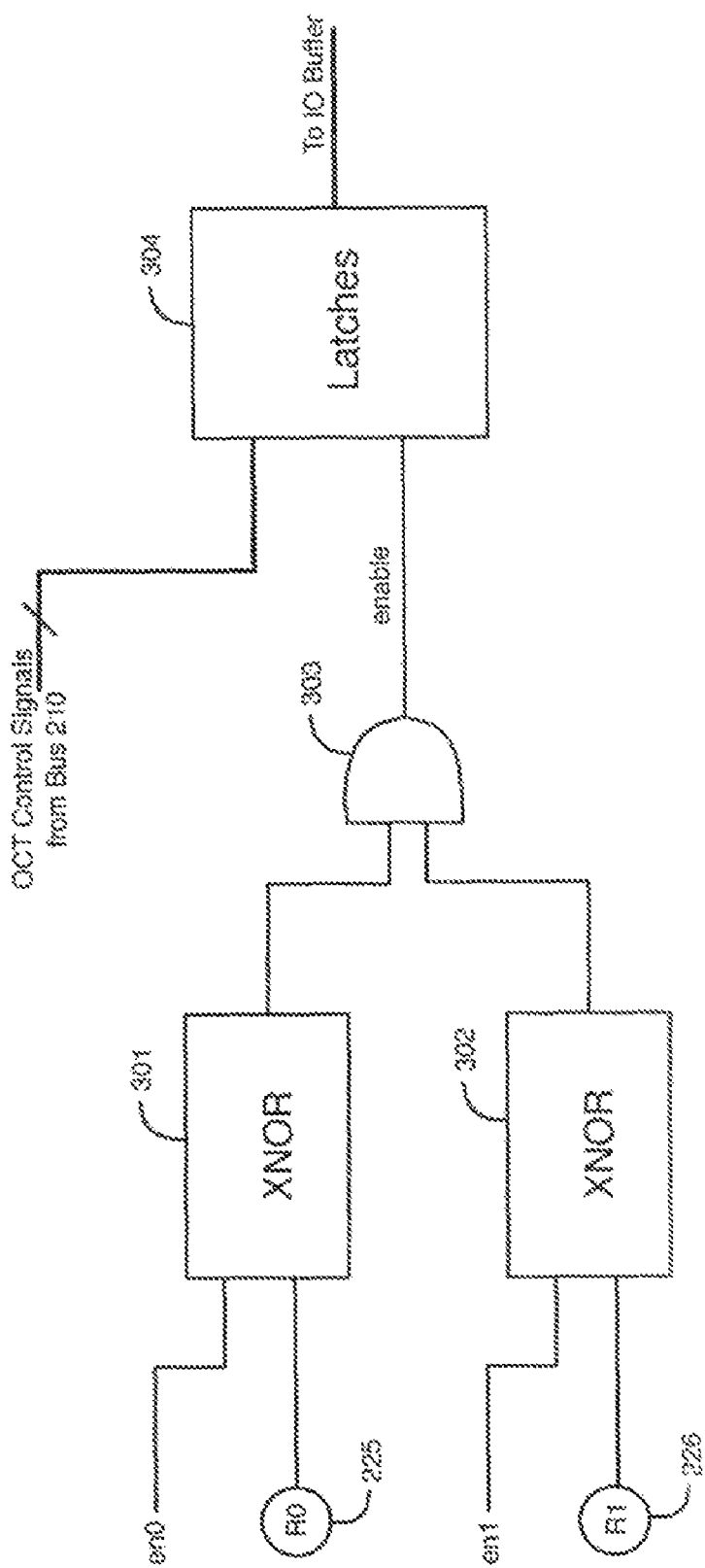
FIG. 3 is a detailed diagram of an OCT select logic block, according to another embodiment of the present invention.

The states of CRAM bits 225-226 and the 2-bit enable code from counter 206 determine when OCT select logic blocks 211-212 transmit the OCT control signals on bus 210 to the IO buffers. An example of an OCT select logic block of the present invention is shown in FIG. 3. FIG. 3 illustrates only one embodiment of an OCT select logic block. Many other embodiments of OCT select logic blocks can also be used to implement the present invention.

The OCT select logic block of FIG. 3 includes two XNOR gates 301 and 302, an AND gate 303, and a set of latches 304. XNOR gates 301 and 302 are exclusive NOR gates that each generate the inverse of an exclusive OR function. The output of an XNOR gate is high only when both inputs are low or both inputs are high. XNOR gate 301 receives CRAM bit 225 at a first input and the first bit en0 of the 2-bit enable code from counter 206 at a second input. XNOR gate 302 receives CRAM bit 226 at a first input and the second bit en1 of the 2-bit enable code from counter 206 at a second input.

The outputs of XNOR gates 301-302 are transmitted to the two inputs of AND gate 303. AND gate 303 generates an enable signal that is transmitted to inputs of a set of latches 304. The enable signal output of AND gate 303 is high only when en0 equals CRAM bit 225 and en1 equals CRAM bit 226.

According to one particular example of FIG. 3, latches 304 include 14 latches. Each of the latches is coupled to receive one of the parallel OCT control signals from bus 210. The outputs of latches 304 are coupled to an IO buffer (or multiple IO buffers).

When the enable signal from AND gate 303 is high, latches 304 store the states of the OCT control signals on bus 210 and transmit the stored signals to the IO buffer (or buffers). When the enable signal from AND gate 303 is low, latches 304 prevent the OCT control signals on bus 210 from being transmitted to the IO buffer (or buffers). Each bit of the OCT control signals selectively enables a transistor in the IO buffer to control the on-chip termination impedance at an IO pin.

The states of CRAM bits 225 and 226 are selected to allow the OCT control signals from a particular OCT controller to be transmitted to the IO buffers in IO bank 200. For example, CRAM bits 225 and 226 can be set to 00 to allow OCT control signals from controller 201 to control IO buffers in IO bank 200 when the 2-bit enable code (en0 and en1) equals 00.

In general, the CRAM bits in each IO bank are pre-configured to select the OCT control signals from a particular OCT controller to control the on-chip termination impedance in that IO bank. If desired, the OCT control signals from one OCT controller can control the on-chip termination impedance in two (or more) IO banks by selecting the appropriate CRAM bits for the corresponding IO banks. The present invention provides the flexibility of allowing any OCT controller to control the on-chip termination impedance in any IO bank on the chip.

According to further embodiments of the present invention, an integrated circuit can have more than 4 (or less than 4) OCT controllers than can transmit OCT control signals along a shared parallel bus to any of the IO banks on the IC.

Figure 4:
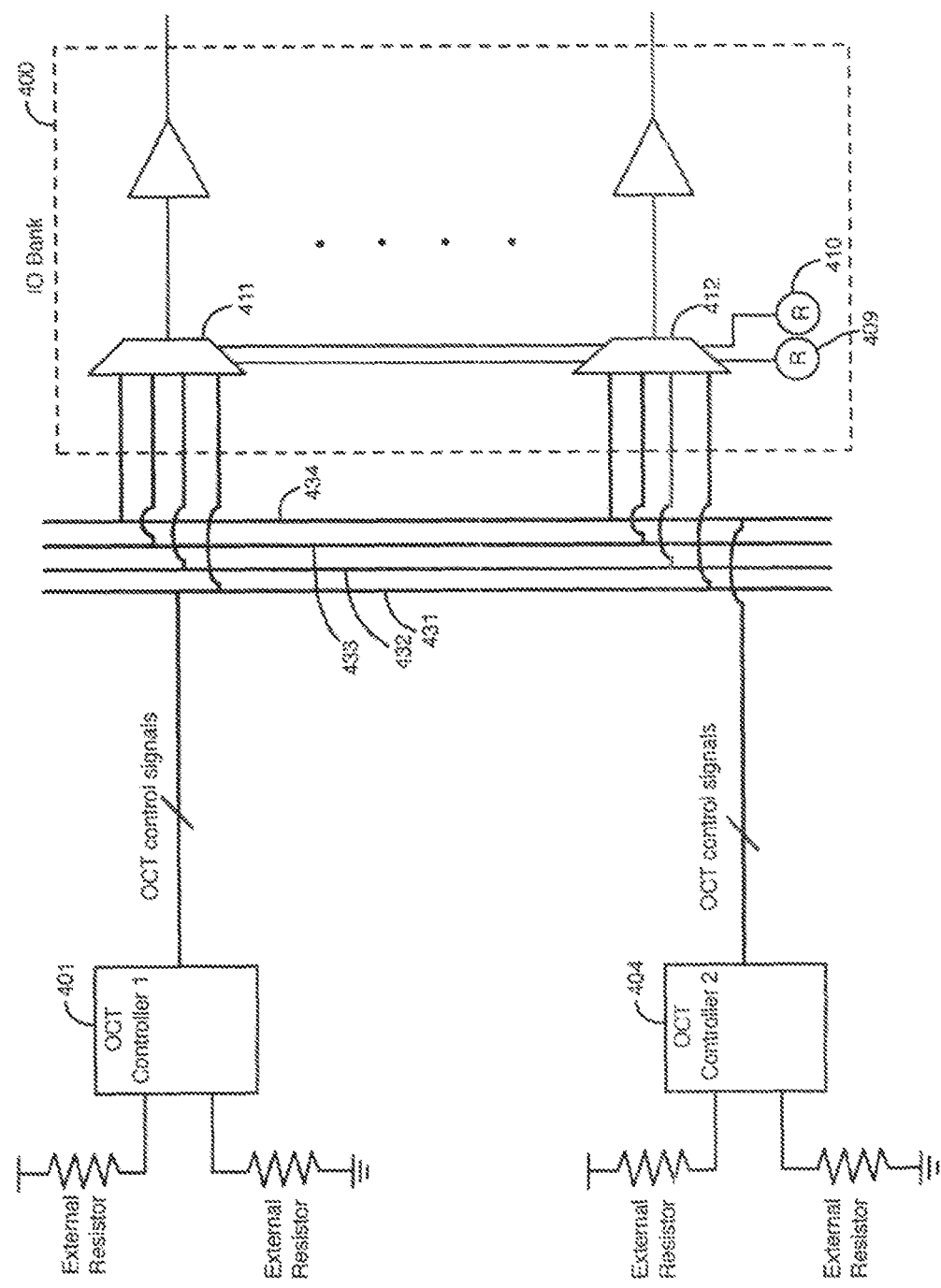
FIG. 4 illustrates a portion of an integrated circuit with OCT controllers that can be selectively coupled to an IO bank through a set of multiplexers, according to another embodiment of the present invention.

According to a further embodiment of the present invention, OCT controllers on an integrated circuit (IC) transmit OCT control signals in parallel around the periphery of the IC to each IO bank along separate buses. This embodiment of the present invention is illustrated in FIG. 4. FIG. 4 shows a partial block diagram of an IC having four OCT controllers that can selectively control the on-chip termination in any of the IO banks on the IC. Only two of the OCT controllers 401 and 404 are illustrated in FIG. 4 to simplify the drawing.

The IC of FIG. 4 has four buses 431-434. Each bus 431-434 has a set of parallel signal lines (e.g., 14 bits in each bus). Each of the four OCT controllers can transmit OCT control signals to any IO bank on the IC in parallel through only one of buses 431-434. For example, OCT controller 401 can transmit OCT control signals through bus 431 to IO bank 400. As another example, OCT controller 404 can transmit OCT control signals through bus 434 to IO bank 400.

Two CRAM bits 409 and 410 are used in IO bank 400 to select OCT control signals from one of the 4 different OCT controllers using a block of 4-to-1 multiplexers. For example, multiplexers 411 and 412 can select OCT control signals from OCT controllers 401 or 404.

The number of multiplexers in each IO bank is dependent on the number of OCT control signals generated by each OCT controller. For example, if each OCT controller generates 14 OCT control signals, then each IO bank contains 14 4-to-1 multiplexers that can select signals from any of the OCT controllers. The multiplexers couple the OCT control signals received from one of buses 431-434 to IO buffers to provide on-chip termination control. According to further embodiments of the present invention, an IC can have more than 4 (or less than 4) OCT controllers that each transmit OCT control signals along a separate bus to any of the IO banks on the IC.

Figure 5:
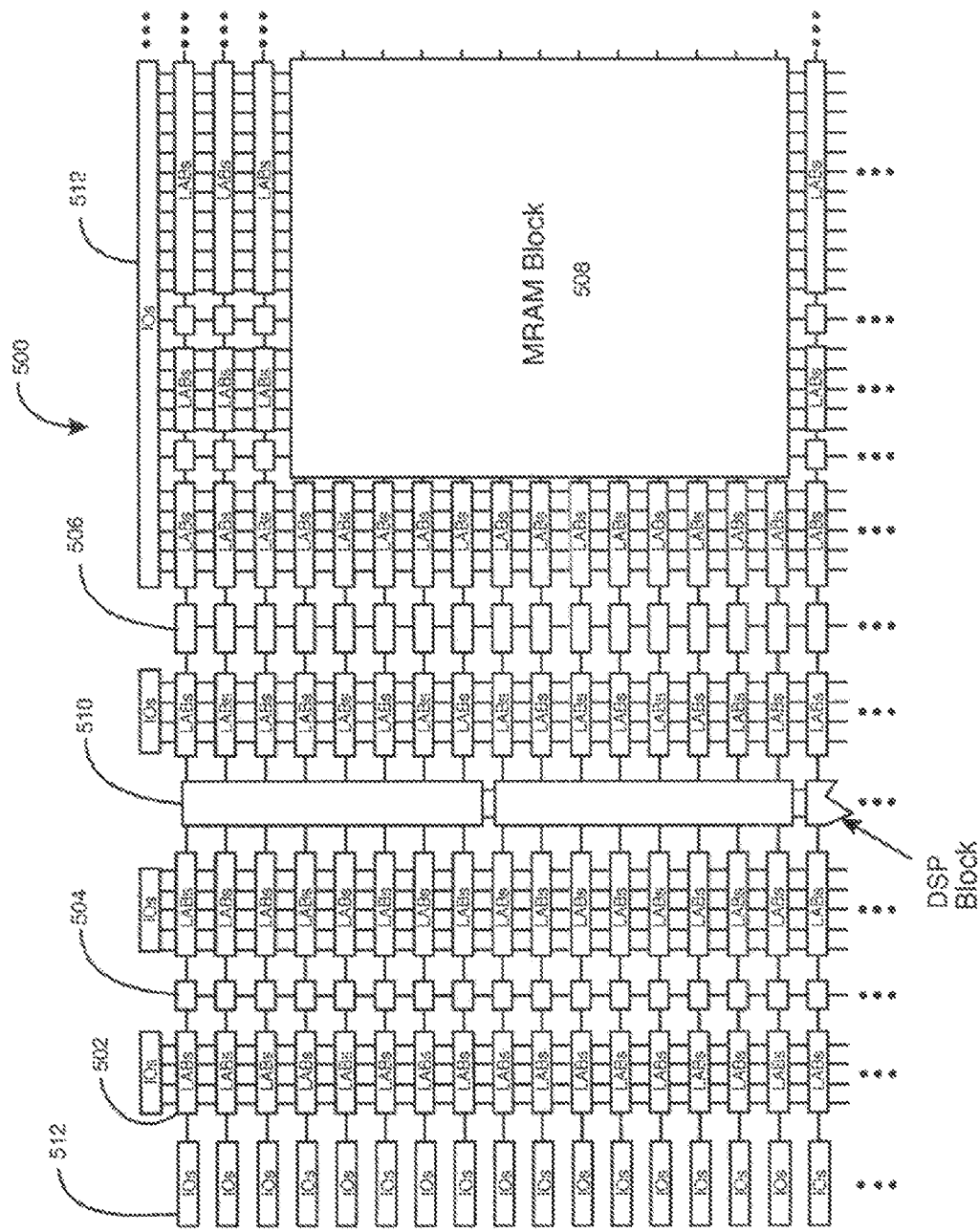
FIG. 5 is a simplified block diagram of a field programmable gate array that can embody the techniques of the present invention.

FIG. 5 is a simplified partial block diagram of an FPGA 500 that can include aspects of the present invention. FPGA 500 is merely one example of an integrated circuit that can include features of the present invention. It should be understood that the present invention can be applied to numerous types of circuits such as field programmable gate arrays (FPGAs), programmable logic devices (PLDs), complex programmable logic devices (CPLDs), programmable logic arrays (PLAs), and application specific integrated circuits (ASICs).

FPGA 500 includes a two-dimensional array of programmable logic array blocks (or LABs) 502 that are interconnected by a networked of column and row interconnect conductors of varying length and speed. LABs 502 include multiple (e.g., 10) logic elements (or LEs).

An LE is a programmable logic block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 500 also includes a distributed memory structure including RAM blocks of varying sizes provided throughout the array. The RAM blocks include, for example, blocks 504, blocks 506, and block 508. These memory blocks can also include shift registers and FIFO buffers.

FPGA 500 further includes digital signal processing (DSP) blocks 510 that can implement, for example, multipliers with add or subtract features. IO blocks (IOs) 512 located, in this example, around the periphery of the chip support numerous single-ended and differential input/output standards. The IO blocks contain IO buffers and are typically grouped into IO banks. It is to be understood that FPGA 500 is described herein for illustrative purposes only and that the present invention can be implemented in many different types of PLDs, FPGAs, and the like.

Figure 6:
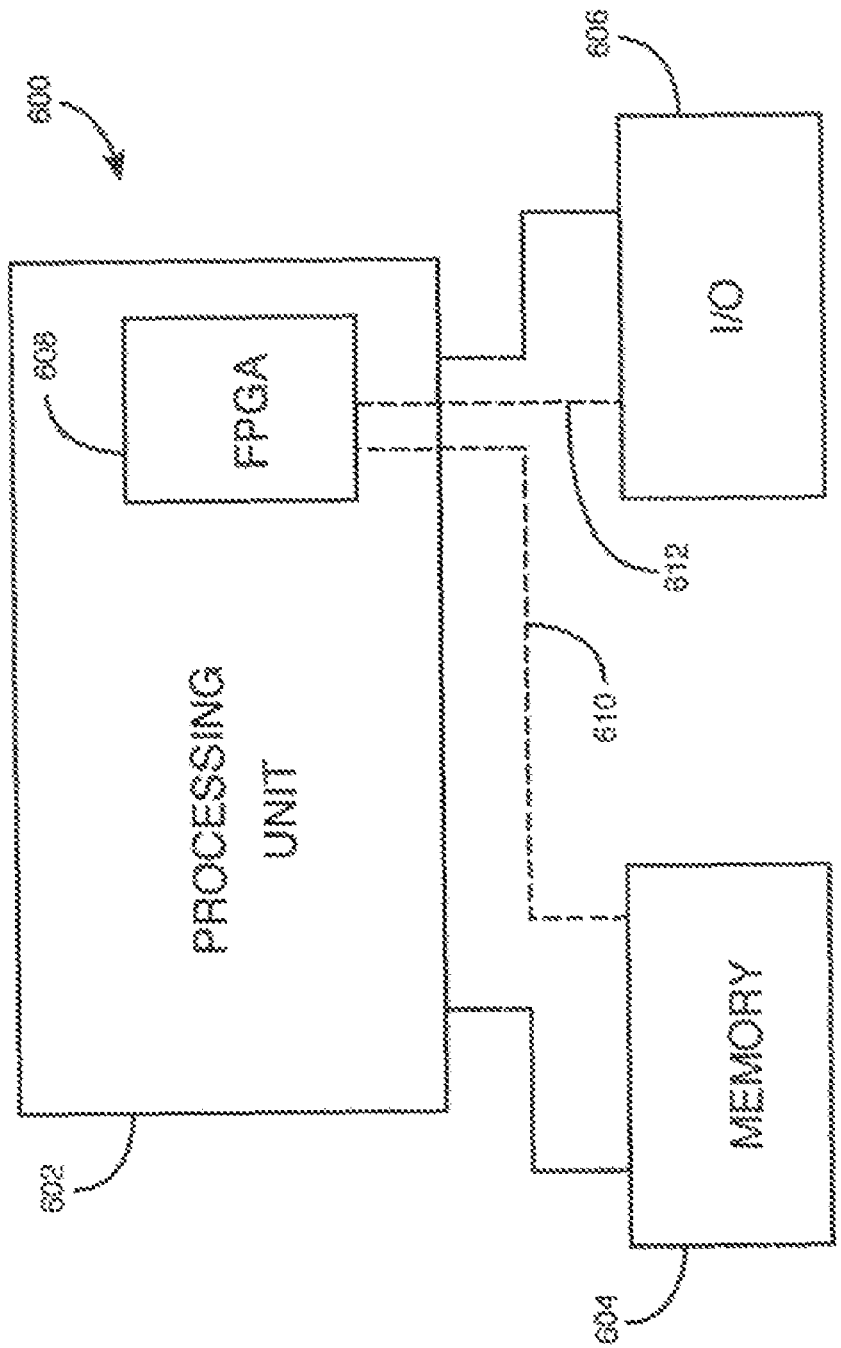
FIG. 6 is a block diagram of an electronic system that can implement embodiments of the present invention.

The present invention can also be implemented in a system that has an FPGA as one of several components. FIG. 6 shows a block diagram of an exemplary digital system 600 that can embody techniques of the present invention. System 600 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 600 can be provided on a single board, on multiple boards, or within multiple enclosures.

System 600 includes a processing unit 602, a memory unit 604 and an I/O unit 606 interconnected together by one or more buses. According to this exemplary embodiment, an FPGA 608 is embedded in processing unit 602. FPGA 608 can serve many different purposes within the system in FIG. 6. FPGA 608 can, for example, be a logical building block of processing unit 602, supporting its internal and external operations. FPGA 608 is programmed to implement the logical functions necessary to carry on its particular role in system operation. FPGA 608 can be specially coupled to memory 604 through connection 610 and to I/O unit 606 through connection 612.

Processing unit 602 can direct data to an appropriate system component for processing or storage, execute a program stored in memory 604 or receive and transmit data via I/O unit 606, or other similar function. Processing unit 602 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 608 can control the logical operations of the system. As another example, FPGA 608 acts as a reconfigurable processor, which can be reprogrammed as needed to handle a particular computing task. Alternately, FPGA 608 can itself include an embedded microprocessor. Memory unit 604 can be a random access memory (RAM), read only memory (ROM), fixed or flexible disk media, PC Card flash disk memory, tape, or any other storage means, or any combination of these storage means.

The foregoing description of the exemplary embodiments of the invention has been presented for the purposes of illustration and description. It is not intended to be exhaustive or to limit the invention to the precise form disclosed. A latitude of modification, various changes, and substitutions are intended in the present invention. In some instances, features of the invention can be employed without a corresponding use of other features as set forth. Many modifications and variations are possible in light of the above teachings, without departing from the scope of the invention. It is intended that the scope of the invention be limited not with this detailed description, but rather by the claims appended hereto.

What is claimed is:

1. An integrated circuit comprising:
    a first on-chip termination controller that generates a first set of control signals;
    a second on-chip termination controller that generates a second set of control signals;
    a first bus;
    first drivers that drive the first set of control signals from the first on-chip termination controller to the first bus in response to an enable code having a first value, wherein the enable code comprises at least one bit;
    second drivers that drive the second set of control signals from the second on-chip termination controller to the first bus in response to the enable code having a second value; and
    a first input/output (IO) bank that causes control signals from the first bus to control an on-chip termination impedance of at least one buffer in response to the enable code.

2. The integrated circuit defined in claim 1 wherein the first bus is routed around a periphery of the integrated circuit to IO banks adjacent to each edge of the integrated circuit.

3. The integrated circuit defined in claim 1 further comprising:
    a second bus coupled to transmit the enable code to the first and the second on-chip termination controllers and the first IO bank.

4. The integrated circuit defined in claim 1 wherein the first set of control signals control first pull-up and first pull-down transistors in a first buffer, and the second set of control signals control second pull-up and second pull-down transistors in a second buffer.

5. The integrated circuit defined in claim 1 wherein the first IO bank comprises a first select logic block that causes the first set of control signals on the first bus to control on-chip termination impedance in a first buffer in response to the enable code having the first value,
    and wherein the integrated circuit further comprises a second select logic block that causes the second set of control signals on the first bus to control on-chip termination impedance in a second buffer in response to the enable code having the second value.

6. The integrated circuit defined in claim 5 wherein the first and the second select logic blocks include latches that store signals received on the first bus in response to the enable code.

7. The integrated circuit defined in claim 1 wherein the first IO bank comprises a select logic block that causes the first set of control signals on the first bus to control on-chip termination impedance in a buffer when the enable code has a value that is selected by control RAM.

8. The integrated circuit defined in claim 1 further comprising:
    a third on-chip termination controller that generates a third set of control signals;
    third drivers that drive the third set of control signals from the third on-chip termination controller to the first bus in response to the enable code having a third value; and
    a second input/output (IO) bank that causes control signals from the first bus to control an on-chip termination impedance of at least one buffer in response to the enable code.

9. The integrated circuit defined in claim 1 wherein the integrated circuit is a field programmable gate array.

10. The integrated circuit defined in claim 9 wherein the field programmable gate array is part of a digital system that includes a processor and memory.

11. A method for controlling on-chip termination impedance on an integrated circuit, the method comprising:
    generating a first set of on-chip termination control signals using a first controller;
    generating a second set of on-chip termination control signals using a second controller;

transmitting the first set of on-chip termination control signals to a first parallel bus using first drivers in response to an enable code having a first value;

transmitting the second set of on-chip termination control signals to the first parallel bus using second drivers in response to the enable code having a second value; and controlling on-chip termination impedance in a first input/output (IO) bank that is programmably coupled to receive on-chip termination control signals from the first parallel bus and that transmits the on-chip termination control signals to a first buffer in response to the enable code.

12. The method defined in claim 11 wherein the enable code is transmitted along a second bus.

13. The method defined in claim 12 wherein the enable code is generated by a counter circuit.

14. The method defined in claim 11 wherein controlling on-chip termination impedance in the first IO bank that is programmably coupled to receive on-chip termination control signals from the first parallel bus further comprises programmably coupling the first IO bank to the first parallel bus in response to receiving CRAM bits and a predefined value of the enable code at select logic blocks.

15. The method defined in claim 14 wherein the select logic blocks include latches that store signals received on the first parallel bus in response to the enable code.

16. The method defined in claim 11 further comprising:

generating a third set of on-chip termination control signals at a third controller;

transmitting the third set of on-chip termination control signals to the first parallel bus using third drivers in response to the enable code having a third value; and controlling on-chip termination impedance in a second IO bank that is programmably coupled to receive on-chip termination control signals from the first parallel bus and that transmits the on-chip termination control signals from the first parallel bus to a second buffer in response to the enable code.

17. The method defined in claim 11 wherein the integrated circuit is a field programmable gate array.

18. An integrated circuit comprising:

first and second on-chip termination (OCT) controllers that generate first and second on-chip termination control signals;

input/output (IO) banks that each comprise IO buffers and select logic blocks; and a parallel bus, wherein the first OCT controller comprises first drivers that drive the first on-chip termination control signals from the first OCT controller to the parallel bus when an enable code has a first value, wherein the second OCT controller comprises second drivers that drive the second on-chip termination control signals from the second OCT controller to the parallel bus when the enable code has a second value, and wherein the select logic blocks in each IO bank are programmably coupled to transmit the on-chip termination control signals from the parallel bus to the IO buffers in response to the enable code.

19. The integrated circuit defined in claim 18 wherein a first one of the select logic blocks transmits the first on-chip termination control signals to a first IO buffer when the enable code has the first value, and a second one of the select logic blocks transmits the second on-chip termination control signals to a second IO buffer when the enable code has the second value.

20. The integrated circuit defined in claim 18 wherein each of the OCT controllers further comprises:

a comparator;

OCT calibration logic coupled to an output of the comparator; and transistors that are coupled in parallel to an output of the OCT calibration logic and an input of the comparator.

* * * * *